United States Patent
Li et al.

(10) Patent No.: US 7,071,565 B2
(45) Date of Patent: Jul. 4, 2006

(54) PATTERNING THREE DIMENSIONAL STRUCTURES

(75) Inventors: Calvin K. Li, Fremont, CA (US); N. Johan Knall, Sunnyvale, CA (US); Michael A. Vyvoda, Fremont, CA (US); James M. Cleeves, Redwood City, CA (US); Vivek Subramanian, Redwood City, CA (US)

(73) Assignee: Sandisk 3D LLC, Sunnyvale, CA (US)

( * ) Notice: Subject to any disclaimer, the term of this patent is extended or adjusted under 35 U.S.C. 154(b) by 0 days.

(21) Appl. No.: 10/255,884

(22) Filed: Sep. 26, 2002

(65) Prior Publication Data

US 2003/0025210 A1    Feb. 6, 2003

Related U.S. Application Data

(62) Division of application No. 09/746,204, filed on Dec. 22, 2000, now Pat. No. 6,627,530.

(51) Int. Cl.
H01L 23/48 (2006.01)
H01L 23/52 (2006.01)
H01L 29/40 (2006.01)
G11C 8/00 (2006.01)

(52) U.S. Cl. .................. 257/775; 257/776; 257/758; 365/242; 365/243

(58) Field of Classification Search ............... 257/775, 257/776, 734, 108, 421, 423, 427, 295, 774, 257/758; 365/175, 242, 243
See application file for complete search history.

(56) References Cited

U.S. PATENT DOCUMENTS

| | | | |
|---|---|---|---|
| 3,576,549 A | 4/1971 | Hess et al. | |
| 3,582,908 A | 6/1971 | Koo et al. | |
| 3,634,929 A | 1/1972 | Yoshida et al. | |
| 3,671,948 A | 6/1972 | Cassen et al. | |
| 3,717,852 A | 2/1973 | Abbas et al. | |
| 3,728,695 A | 4/1973 | Frohman-Bentchkowsky | |
| 3,787,822 A | 1/1974 | Rioult | |
| 3,863,231 A | 1/1975 | Taylor | |
| 3,990,098 A | 11/1976 | Mastrangelo | |
| 4,146,902 A | 3/1979 | Tanimoto et al. | |
| 4,203,123 A | 5/1980 | Shanks | |
| 4,203,158 A | 5/1980 | Frohman-Bentchkowsky | |
| 4,281,397 A | 7/1981 | Neal et al. | |
| 4,419,741 A | 12/1983 | Stewart et al. | |
| 4,420,766 A | 12/1983 | Kasten | |
| 4,442,507 A | 4/1984 | Roesner | |
| 4,494,135 A | 1/1985 | Moussie | |

(Continued)

OTHER PUBLICATIONS

Drohman-Bentchkowsky, D., "A Fully Decoded 2048-Bit Electrically Programmable FAMOS Read-Only Memory," IEEE Journal of Solid-State Circuits, vol. SC-6, No. 5, Oct. 1971, pp. 301-306.

(Continued)

*Primary Examiner*—Nathan J. Flynn
*Assistant Examiner*—Victor A. Mandala, Jr.

(57) ABSTRACT

A three dimensional circuit structure including tapered pillars between first and second signal lines. An apparatus including a first plurality of spaced apart coplanar conductors disposed in a first plane over a substrate; a second plurality of spaced apart coplanar conductors disposed in a second plane, the second plane parallel to and different from the first plane; and a plurality of cells disposed between one of the first conductors and one of the second conductors, wherein each of the plurality of cells have a re-entrant profile.

16 Claims, 6 Drawing Sheets

U.S. PATENT DOCUMENTS

| | | |
|---|---|---|
| 4,499,557 A | 2/1985 | Holmberg et al. |
| 4,507,757 A | 3/1985 | McElroy |
| 4,543,594 A | 9/1985 | Mohsen et al. |
| 4,569,121 A | 2/1986 | Lim et al. |
| 4,646,266 A | 2/1987 | Ovshinsky et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,070,383 A | 12/1991 | Sinar et al. |
| 5,311,039 A | 5/1994 | Kimura et al. |
| 5,334,880 A | 8/1994 | Abadeer et al. |
| 5,391,518 A | 2/1995 | Bhushan |
| 5,441,907 A | 8/1995 | Sung et al. |
| 5,463,244 A | 10/1995 | De Araujo et al. |
| 5,536,968 A | 7/1996 | Crafts et al. |
| 5,675,547 A | 10/1997 | Koga |
| 5,737,259 A | 4/1998 | Chang |
| 5,745,407 A * | 4/1998 | Levy et al. ................. 365/159 |
| 5,792,377 A * | 8/1998 | Belcher et al. ................ 216/87 |
| 5,811,353 A * | 9/1998 | Nanjo ........................ 438/666 |
| 5,835,396 A | 11/1998 | Zhang |
| 5,990,507 A * | 11/1999 | Mochizuki et al. ......... 257/295 |
| 6,190,957 B1 * | 2/2001 | Mochizuki et al. ......... 438/240 |
| 6,288,447 B1 * | 9/2001 | Amishiro et al. ........... 257/758 |
| 6,355,567 B1 * | 3/2002 | Halle et al. ................. 438/700 |
| 6,653,704 B1 * | 11/2003 | Gurney et al. .............. 257/421 |
| 6,713,835 B1 * | 3/2004 | Horak et al. ................ 257/522 |
| 6,754,102 B1 * | 6/2004 | Kleveland et al. ..... 365/185.03 |
| 6,919,637 B1 * | 7/2005 | He et al. .................... 257/758 |

OTHER PUBLICATIONS

Sato, N., "A New Programmable Cell Utilizing Insulator Breakdown," International Electron Devices Meeting, Washington, D.C., Dec. 1-4, 1985, pp. 639-642.

V. Subramanian, "Control of Nucleation and Grain Growth in Solid-Phase Cyrstallized Silicon for High-Performance Thin Film Transistors," published 1998, pp. 1-140.

* cited by examiner

PATTERNING THREE DIMENSIONAL STRUCTURES

CROSS-REFERENCE TO RELATED APPLICATION

The application is a divisional of U.S. patent application Ser. No. 09/746,204, filed Dec. 22, 2000, now U.S. Pat. No. 6,627,530, titled "Patterning Three Dimensional Structures."

BACKGROUND OF THE INVENTION

1. Field of the Invention

The invention relates to three-dimensional circuits and more particularly to the formation of three-dimensional circuits.

2. Background

Three-dimensional circuits are generally those in which active or passive circuit elements are formed over a surface of a planar substrate. A three-dimensional circuit typically interacts with circuit elements formed in a surface of a substrate. A typical monolithic integrated circuit has transistors and other structures formed at least in part in the substrate. A three-dimensional circuit may rely, for example, for signal operation or function on a substrate, but the operation of the circuit elements do not utilize a portion of the substrate. Implementation of three-dimensional circuit arrays include, but are not limited to, memory arrays, resistor arrays, and transistor arrays.

Commonly-owned, U.S. Pat. No. 6,034,882 titled "Vertically Stacked Field Programmable Nonvolatile Memory and Method of Fabrication" and co-pending U.S. patent application Ser. No. 09/560,626, titled "Three-Dimensional Memory Array Method of Fabrication," describes, in one aspect, three-dimensional circuit arrays such as field programmable, nonvolatile memory arrays wherein circuits are fabricated in a vertical arrangement over rather than in a surface of a planar substrate, such as, for example, a semiconductor substrate.

In many instances, it is desirable from a processing standpoint to construct circuit arrays of multiple levels of similar materials. However, processing techniques such as cell definition through etch patterning often rely on materials of different composition to achieve desired patterning. Thus, what is needed are techniques for forming circuit arrays of similar material that offer consistent performance and distinguishable patterning avenues suitable for use in three dimensional circuit arrays.

SUMMARY OF THE INVENTION

The invention provides a technique for patterning circuit structures, including a technique wherein multiple layers of similar material may be selectively patterned to create desired structures.

In one embodiment, the method includes introducing a circuit structure over a substrate in a stacked configuration between a first level of signal line material and a second level of signal line material. The first and second levels of signal line material comprise similar material. The method also includes selectively patterning the second level of signal line material and at least part of the circuit structure, without patterning the first level of signal line material. In this manner, the invention provides a technique wherein multiple signal lines of similar material coupling a respective plurality of circuit levels may be incorporated and patterned sequentially without concern of disruption or damage to previously introduced and patterned signal lines.

One way the second signal line material is patterned exclusive of the first signal line material is by modifying the etch chemistry from a first chemistry that favors the etching of signal line material (e.g., second signal line material) to a second chemistry that disfavors the etching of signal line material prior to contacting, for example, the first signal line material.

A second way the second signal line material is patterned exclusive of the first signal line material is by including an etch stop between the first and second signal line material. Examples of suitable etch stop materials include, but are not limited to, materials that are transient or temporary in that, for example, the material may be removed or changed with subsequent processing (e.g., thermal processing). Alternatively, the etch stop material may form part of the three-dimensional circuit structure between the first and second signal line materials.

The invention also describes a technique for patterning a desired edge angle by modifying, for example, an etch chemistry between a first chemistry that is generally anisotropic and a second chemistry that has a horizontal component. According to this example, an edge angle that is slightly re-entrant (i.e., has a negative slope) may be realized.

Additional features, embodiments, and benefits will be evident in view of the figures and detailed description presented herein.

DETAILED DESCRIPTION OF EMBODIMENTS OF THE INVENTION

A three dimensional circuit is disclosed, as well as methods for forming such a circuit. The invention finds particular utility in fabricating three dimensional circuit arrays comprising one or more circuit levels, each level containing a plurality of individual circuit elements, such as memory elements, logic devices or gates, protection, operation, or current control devices, and routing or switching elements. A circuit level in this context includes a logical unit that could include active devices such as transistors, diodes, thyristors, and quantum dots; passive devices such as resistors, capacitors, fuses, antifuses, and interconnects; or combinations of active and passive devices. One example of a three-dimensional circuit array is a three-dimensional memory array. Typically, such a structure includes a three-dimensional circuit formed over a substrate. The substrate may contain additional active circuitry or may provide physical support for the overlying three-dimensional circuit structure.

FIGS. 1–8 describe one embodiment of fabricating a three dimensional memory array having at least two levels of memory cells introduced above a substrate. The structure formed is similar to that described in U.S. Pat. No. 6,034,882, incorporated herein by reference. Specific fabrication techniques are presented in this embodiment to illustrate the claimed invention. It is appreciated that the techniques set forth herein are intended to illustrate the invention and not intended to limit the invention as set forth in the claims to any particular three dimensional structure. Instead, there are many circuit structures, including, to name a few, transistor, resistor, and other memory structures to which the techniques presented herein find applicability.

Figure 1:
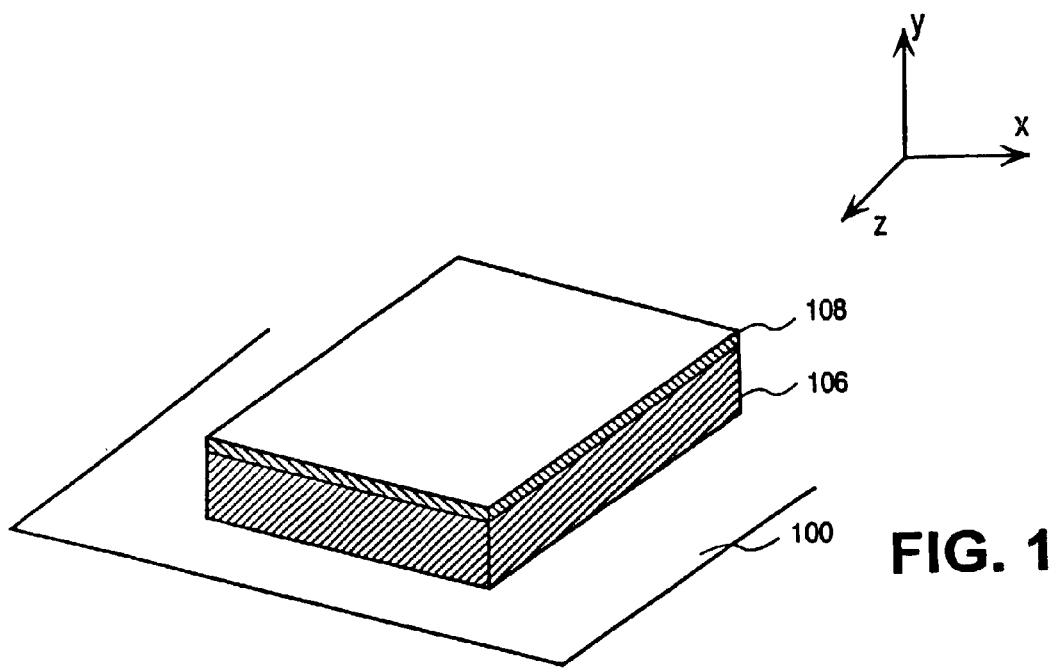
FIG. 1 is a perspective view of the materials of a silicide of a first phase overlying a substrate and used in the fabrication of conductors or signal lines for a memory array in accordance with a first embodiment of the invention.

Referring to FIG. 1, in this example of fabricating a memory array, substrate 100 is, for example, a semiconductor substrate, such as a silicon substrate. Other substrates including, but not limited to, ceramic substrates, organic substrates, printed circuit boards (PCBs), organic membranes, polyamide sheets, and glass substrates are suitable. In the case of a silicon semiconductor substrate, the three dimensional memory array may be fabricated over the substrate at the wafer level and then formed into discrete die or chips, each die or chip having a three dimensional memory array formed thereon. Alternatively, where it is desired, the introduction of a three dimensional memory array may occur at the die or chip level, i.e., once a die or chip is singulated from a wafer.

FIG. 1 shows substrate 100 that is, for example, a semiconductor substrate having introduced over a surface thereof, material to form a refractory metal silicide that will serve as first conductor or first signal line for a first level memory cell formed thereon. In one example, the materials are introduced over a significant portion, including the entire portion, of substrate 100. In other instances, the materials are patterned into a smaller portion of substrate 100 that is to occupy the three dimensional memory array. It is appreciated that the signal line material may also, in some instances, serve as a portion of a circuit device or structure to which the signal line material is subsequently coupled. For example, the signal line material may serve as a portion of a Schottky diode useful as an isolation device in a memory cell. Thus, the description herein of signal lines and circuit devices or structures should be given an inclusive interpretation to be, in some instances, one and the same.

One way to form a refractory metal silicide is to combine silicon with a refractory metal. In one example, amorphous silicon is introduced over substrate 100 through a sputter deposition to a thickness of greater than 50 nanometers (nm). A native oxide ($SiO_2$) is thermally grown on the amorphous silicon material to a thickness of about 1–3 nm. Additional amorphous silicon of a thickness of about 10 nm is introduced by sputter deposition followed by the introduction of refractory metal material of, for example, titanium to a thickness of about 20 nm. An additional 10 nm of amorphous silicon is then introduced over refractory metal material.

Titanium suicides generally have two phases, represented by $TiSi_x$: a high resistivity, titanium-rich phase, where x is less than 2, and a low resistivity, silicon-rich phase where x is equal to 2. The silicon-rich phase itself generally has two configurations: C49 and C54. For high performance silicides, the C54 configuration is generally desired. At annealing temperatures below 700° C., however, generally there is little formation of the preferred C54 material, but substantially only the formation of the high resistivity, titanium-rich phase silicide.

FIG. 1 shows the formation of a titanium-rich, high resistivity phase silicide material according to one aspect of the invention. According to this aspect, the silicide is retained in a high resistivity phase, illustrated as first conductor or signal line material 106 at this stage of the formation process. To form the titanium-rich suicide, the structure is subjected to a thermal anneal below 700° C. One example is a rapid thermal anneal at 600° C. for 60 seconds. Once formed, native oxide 108 (e.g., a thickness of about 1–3 nm) is permitted to grow over the surface of first conductor or signal line material 106 by exposing the structure to an oxygen-containing atmosphere. Such native oxide 108 is typically consumed into the silicide during a thermal transformation between the titanium-rich (high resistivity) phase and the silicon-rich (low resistivity) phase. Since the process described in this embodiment maintains the silicide in a titanium-rich phase, native oxide 108 is retained and the benefits of its retention will become clear in the following discussion. When desired, native oxide 108 may be inhibited by, for example, performing the anneal at 400° C. or less or limiting the structure to an oxygen-free ambient.

Figure 2:
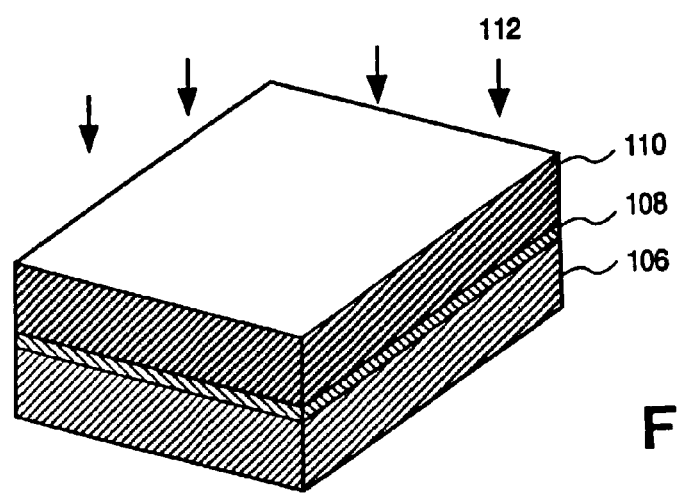
FIG. 2 illustrates a perspective view of the structure of FIG. 1 after the introduction of first steering element material and illustrates the further processing of the steering element material after introduction.

FIG. 2 shows the structure of FIG. 1 after the introduction of first steering element material 110. In one example, first steering element material 110 is formed as a portion of a diode (e.g., PN diode). It is to be appreciated that other steering elements such as a metal-semiconductor Schottky diode, a junction field-effect transistor, a MOSFET, a Zener diode, an avalanche diode, a tunnel diode, a four-layer diode (SCR), or a PN diode may alternatively be substituted. According to this example of introducing a portion of a PN diode, silicon is introduced by a CVD process to a thickness of about 3000 Å.

In one example, the process temperature for introducing a steering element material 110 of a diode is maintained between 400° C. and 700° C. to inhibit the interaction between the titanium silicide and first steering element material 110. Next, dopants are introduced (e.g., implanted) to form the diode. In one example, a PN junction diode is formed by implanting a P-type dopant, such as boron, followed by the implantation of an N-type dopant, such as phosphorous or arsenic, according to known implantation techniques. The dopant introduction is illustrated by reference numeral 112.

Figure 3:
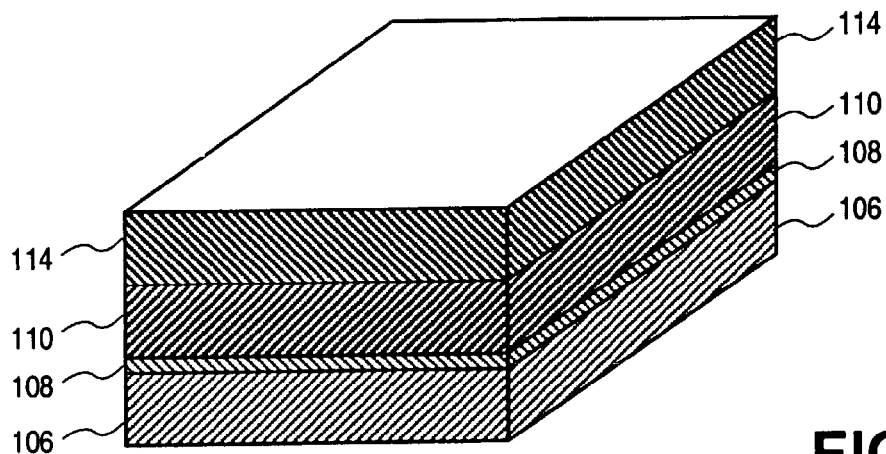
FIG. 3 illustrates a perspective view of the memory cells of FIG. 2 after the introduction of first state change element material.

FIG. 3 shows the structure of FIG. 2 after the introduction of first state change element material 114. Examples of the types of state change element material that may be employed include, but are not limited to, dielectric materials, semiconductor materials, and metal materials. Examples of suitable state change elements include, but are not limited to, dielectric-rupture antifuses, semiconductor antifuses, metal filament electromigration fuses, ferroelectric capacitors, capacitors with trap-induced hysteresis, and coulomb blockade devices. For purposes of this discussion, first state change element material 114 is a dielectric-rupture antifuse, such as a silicon dioxide ($SiO_2$) material. A $SiO_2$ material deposited to a thickness of approximately 100 angstroms (Å) or less is suitable as a dielectric-rupture antifuse for voltages on the order of less than 15 volts.

Figure 4:
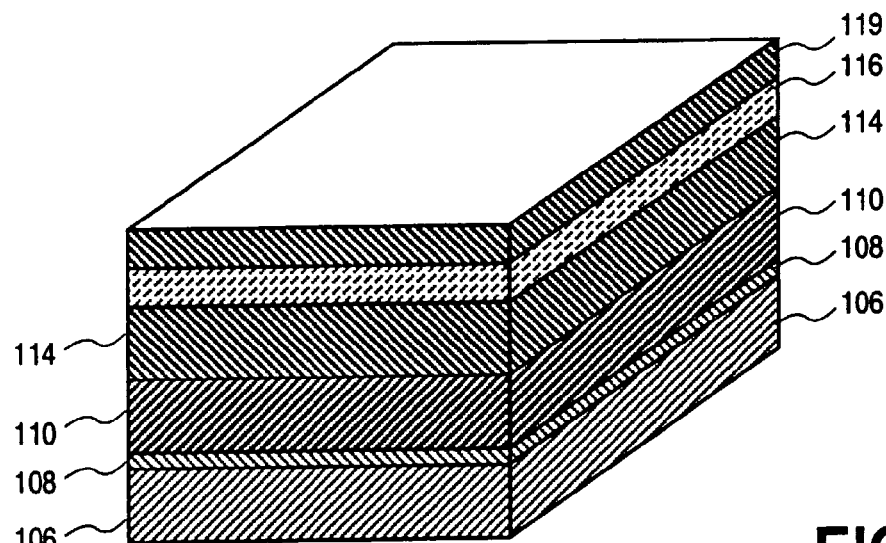
FIG. 4 illustrates a perspective view of the structure of FIG. 3 after the introduction of a first conductivity material and a hard mask material.

FIG. 4 shows the structure of FIG. 3 after the introduction of first conductivity material 116 of, for example, silicon doped with an $N^+$-type dopant such as phosphorous or arsenic. The $N^+$-type silicon is introduced in one sense to provide electrical contact to an overlying conductor material.

Following the introduction of first conductivity material 116 is the introduction of optional hard mask material 119 of, for example, $SiO_2$. A material including, but not limited to a photoimageable material (e.g., photoresist) is then introduced over hard mask material 119 as a conductor mask. The conductor mask defines the features of the first conductors or signal lines and the z-direction thickness of the first level memory cells.

Following the introduction of the conductor mask (not shown), the structure is subjected to etch patterning of the multi-layer stack into strips. In one embodiment, the etch of first level materials is desired to be re-entrant. First level materials are preferably etched such that the angle between the plane of the substrate and the sidewall of the stack is between about 85° and 90° (i.e., a "negative" slope). A negative slope describes a "re-entrant" profile. A re-entrant profile inhibits undesired communication between adjacent memory cells (e.g., by "stringers" caused by positively sloped sidewalls). A re-entrant profile is illustrated in the patterned strips shown in FIG. 5 with a vertical projection angle, $\alpha_{xy}$, between 85° and 90°.

One example of a suitable chemistry to etch the introduced materials in an anisotropic (e.g., vertical) and/or re-entrant profile is as follows. First, a carbon tetrafluoride ($CF_4$) gas is used to etch hard mask material 119 of, for example, $SiO_2$ in a substantially anisotropic manner. Next, the chemistry is changed to a chemistry of chlorine ($Cl_2$) and hydrobromic acid (HBr). The $Cl_2$/HBr chemistry etches, in a generally anisotropic fashion, first conductivity material 116, first state change element material 114, and first steering element material 110.

To reduce the possibility of producing strips having a positive slope (i.e., ($\alpha_{xy}$ greater than 90°), the etch chemistry is modified to incorporate an etch chemistry with a horizontal- or x-component. One etch chemistry with a horizontal- or x-component that is suitable to etch silicon and $SiO_2$ is a mixture of HBr and $SF_6$. The modification is made at a point in the etch patterning where, for example, a desired re-entrant profile (e.g., $\alpha_{xy}$ between 85°–90°) may be maintained. Modifying the chemistry too soon may cause too great a reentrant angle while too late may result in a vertical component with a positive slope. One way to determine when to modify the etch chemistry is through experimentation, given factors such as the thickness and composition of the first level materials, as well as the etch chemistry.

During the etch of the first level, materials, polymers and other constituents (collectively "polymer") can build up on the side walls of the patterned strips. Polymer build-up has a beneficial attribute in that polymer build-up on an edge of a side wall reduces the horizontal erosion of patterned material. Thus, referring to FIG. 5, in patterning a first portion of the first level material with a substantially anisotropic chemistry (e.g., at least first conductivity material 116 and a portion of first state change element material 114), followed by patterning a second portion with an etch chemistry with a horizontal- or x-component (e.g., etching any remaining portion of first state change element material 114, first steering element material 110, and first conductor or signal line material 106), polymer build-up on the side walls of the previously defined cell material (first portion) inhibits the second etch chemistry from the etching away additional cell material by building up on the side walls. Collectively, the polymer build-up on the defined side walls may be used to define the cell profile, as more polymer build-up tends to form at the superior or top end of the strips (i.e., the first portion). Thus, polymer build-up contributes to a re-entrant profile. The insert in FIG. 5 illustrates polymer build-up 117A on a side wall of a strip.

In some instances, it may be desirable to limit the amount of polymer build-up, for example, in the situation where such polymer build-up will lead to a profile that is too re-entrant, e.g., $\alpha_{xy}$ less than 85°. One way to limit the amount of polymer build-up is to remove the photoimageable (e.g., photoresist) material of the conductor mask and define the cell material using hard mask material 119. In the example of hard mask material 119 of $SiO_2$ and first state change element material 114 of $SiO_2$, the conductor mask of photoresist material would be retained, for example, to pattern hard mask material 119, first conductivity material 116, and first state change element material 114, then removed prior to the etch of first steering element material 110. For a hard mask material of $SiO_2$, an etch chemistry that does not substantially etch $SiO_2$, such as a chemistry of $HBr/He/O_2$, may be used to etch the remainder of the stack and retain the hard mask material. The amount of oxygen in such a chemistry can be reduced, if necessary, to etch through native oxide 108 and form first conductors or signal lines 106A and 106B. It is appreciated that for a different hard mask material, for example, silicon nitride ($Si_3N_4$), the conductor mask of photoresist may be removed, if desired, immediately following the patterning of hard mask material 119 or at some time prior to patterning first state change element material 114 of $SiO_2$, since a chemistry selective for patterning $SiO_2$ and not $Si_3N_4$, may be selected.

Figure 5:
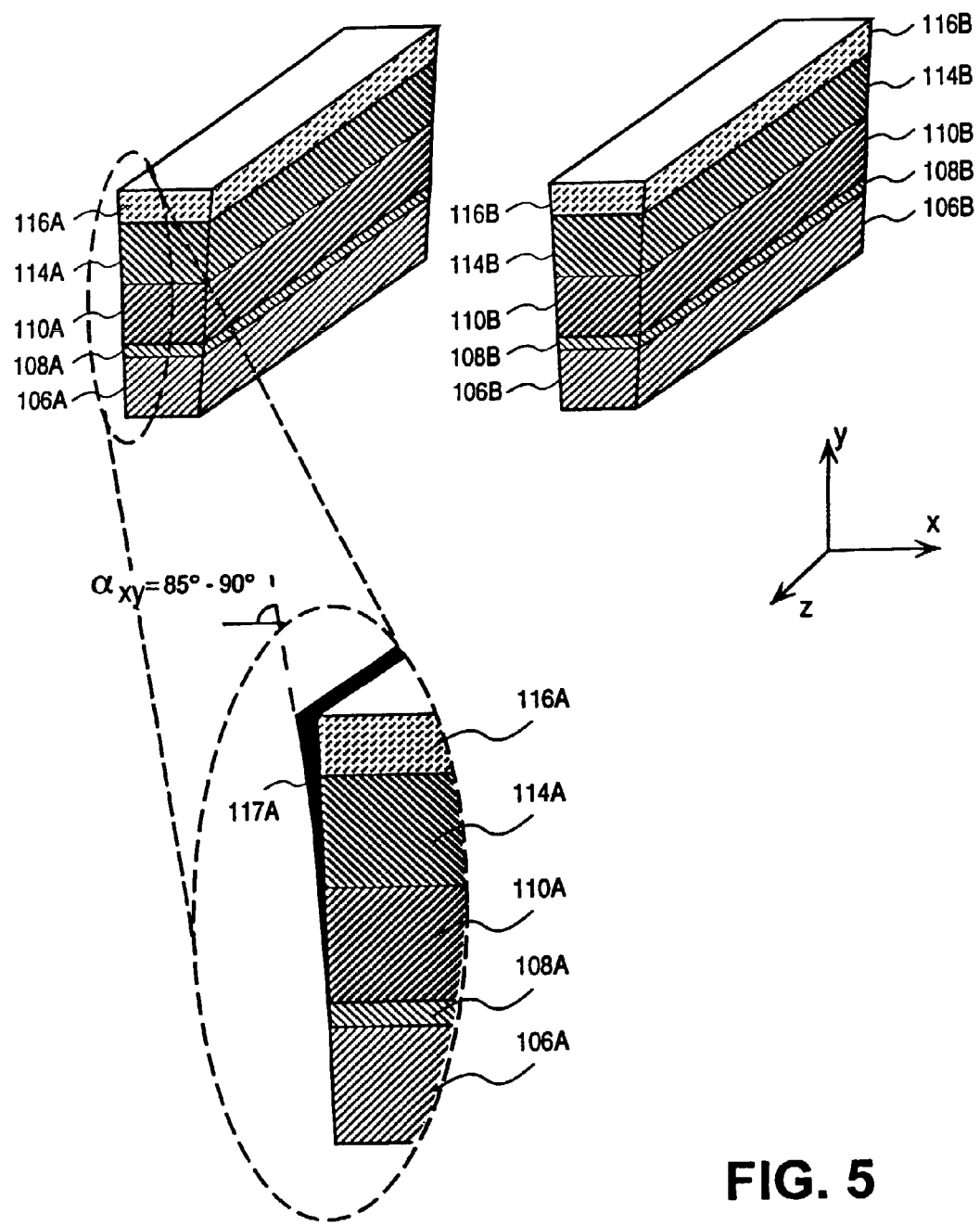
FIG. 5 illustrates a perspective view of the structure of FIG. 4 after patterning the structure into two lines.

As shown in FIG. 5, the introduced materials are patterned into two continuous strips of first level memory cell material over first conductors or signal lines. It is to be appreciated that the two strips are presented as an illustration and that many strips may be patterned depending on the number of desired first level memory cells. The edges of first level memory cell material are aligned in an x- and z-direction to the edges of first conductors or signal lines 106A and 106B, respectively, since both are etched at the same time through the same mask.

Following the patterning of first level memory cell material into strips, a dielectric material or insulator is deposited on the substrate and planarized, using, for example, chemical-mechanical polishing (CMP) or other planarizing technology. For purposes of continued description of the formation of a multi-level array, the dielectric material is not shown. While not shown in FIG. 5 or the other figures, the dielectric material fills the void between the memory cell layer strips and thus adds support to the array. The planarization described should reveal the upper surface of the first level memory cell layer material so that a conductor or signal line material that follows contacts the material. Where hard mask material 119 is introduced, the planarization should remove this material to expose first conductivity material 116. The planarized dielectric material also forms layers through which vias and vertical conductors between the memory cells and the substrate pass.

Figure 6:
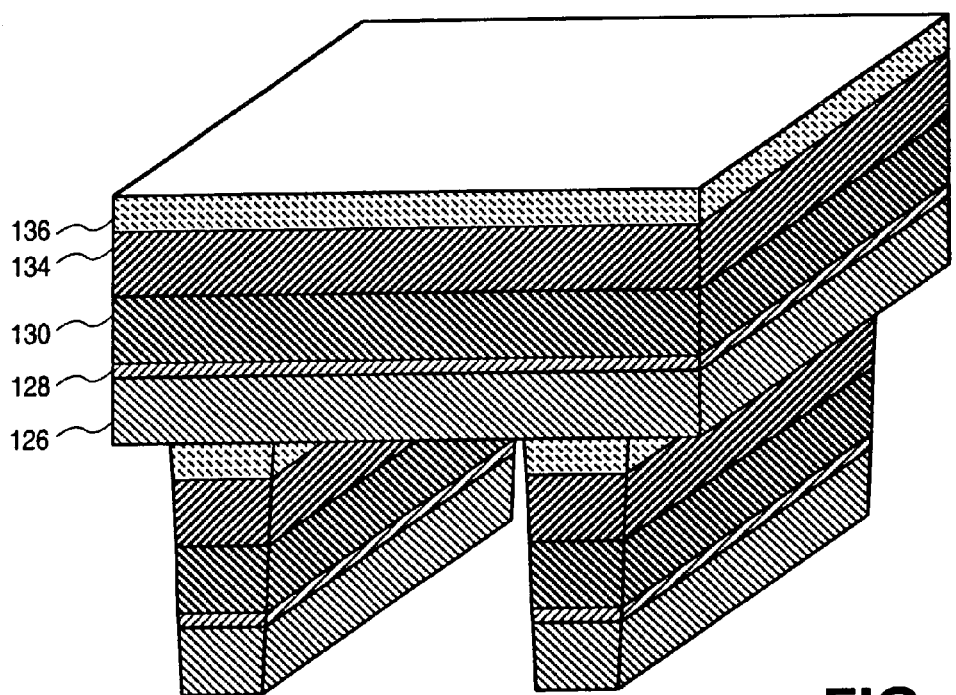
FIG. 6 illustrates a perspective view of the structure of FIG. 5 after the introduction of material to form second conductor or signal line material of a silicide of a first phase over the patterned lines and material to form a second level circuit device.

FIG. 6 shows the structure of FIG. 5 after the introduction of silicon material and refractory metal material over the first level cell material strips (and planarized dielectric material) to form a metal silicide to act as a second conductor or signal line material. The introduction is similar to the introduction described above with reference to FIG. 1 and the accompanying text regarding the formation of a first conductor or signal line material of a silicide. As shown in FIG. 6, in one example, a second titanium silicide is formed as second conductor or signal line material 126. Again, as noted with respect to titanium silicide material, the phase of a titanium silicide as second conductor or signal line material 126 is maintained, at this stage, as a titanium-rich, high resistivity phase ($TiSi_x$, where x is less than 2). Native oxide 128 (e.g., native oxide) is formed, in one instance, over second conductor or signal line material 126 as shown in FIG. 6.

FIG. 6 also shows the structure of FIG. 5 after the introduction of second level memory material. In one example, the second level memory materials are similar to the first level memory materials, although the materials may be different. Where the objective is to form circuit elements in various levels of an array (e.g., memory array) that perform similarly, it may be desirable to form the individual circuit elements of similar materials. In the case of a steering element that is a PN diode, for example, second steering element material 130 is introduced, via, for example, a CVD deposition and dopants are introduced. The dopants may be introduced in the same or different order as in forming first steering element material 110. In one example, the dopants are reversed so that the anode and cathode of the diode may similarly be reversed. Second state change element material 134 is similar to first state change element material 114, such as a dielectric-rupture antifuse material (e.g., $SiO_2$). Second conductivity material 136 is, for example, silicon doped with an $N^+$-type dopants to provide electrical contact with a subsequent conductor or signal line material. The introduction of second conductivity material 136 is followed by the introduction of optional hard mask material 139 of, for example, $SiO_2$.

Figure 7:
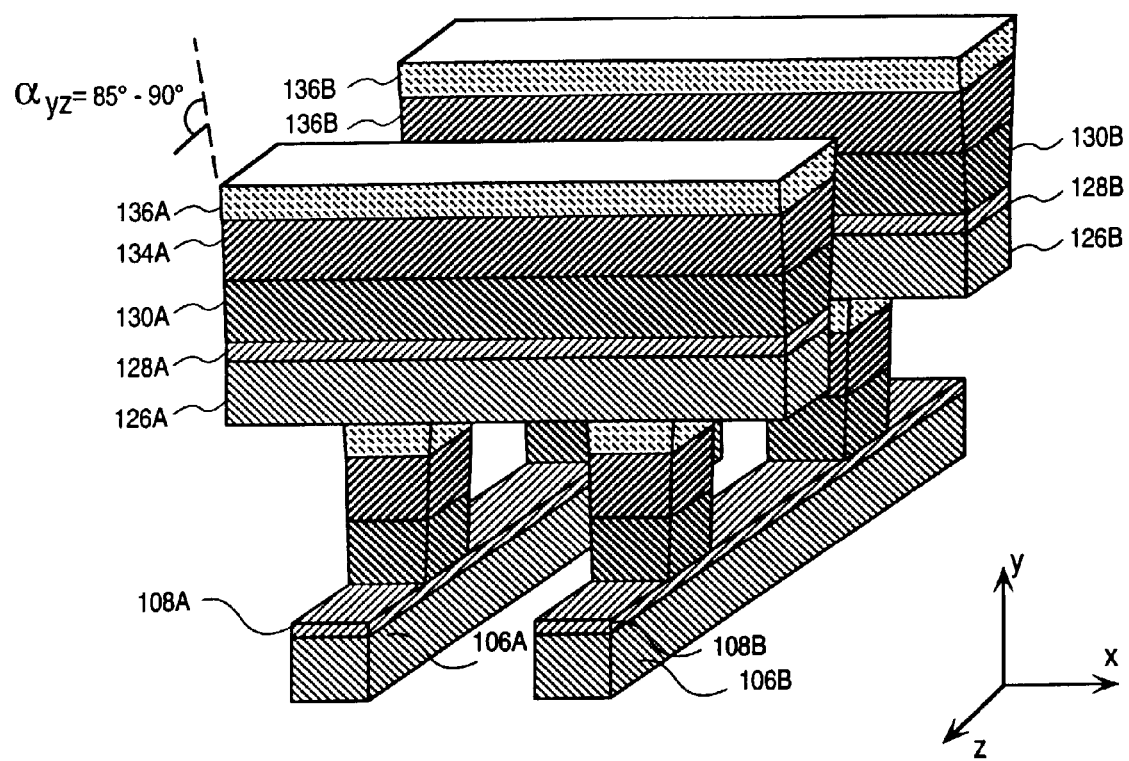
FIG. 7 illustrates a perspective view of the structure of FIG. 6 after patterning the second level material into lines and patterning the first level material into pillars.

At this point, a mask is applied and the structure is etched vertically (e.g., downward) into three distinct strata: a second pillar stack, second conductors or signal lines, and a first pillar stack. The result of the etch is shown in FIG. 7. The mask (not shown) and etch patterning define the features of the second conductors or signal lines and the z-direction thickness of the second level memory cells. The mask and etch patterning also define the z-direction thickness of the first level memory cell material forming such material into pillars (the first pillar stack). Although not shown, a suitable mask includes but is not limited to a photoimageable (e.g., photoresist) mask as known in the art.

The patterning of the second level strips is designed, in this embodiment, to stop at least at the first conductors or signal lines 106A and 106B. It is to be appreciated that, as described above, in this embodiment, first conductors or signal lines 106A and 106B are high resistivity, titanium-rich phase silicide material similar to the material for second conductors or signal lines 126A and 126B. Thus, the etching operation should selectively pattern second conductors or signal lines 126A and 126B while leaving first conductors or signal lines 106A and 106B substantially intact. One way this is accomplished is by modifying the etch chemistry during the patterning (e.g., a chemical process). A second way this is accomplished is by protecting first conductors or signal lines 106A and 106B by an etch stop between the first conductors or signal lines 106A and 106B and the second conductor or signal line material 126 (e.g., a physical process).

Referring to the chemical process, in the example of titanium silicide as a conductor or signal line material, it has been determined that an etch chemistry having a low oxygen concentration will generally etch the titanium-rich silicide. An etch chemistry having a high oxygen concentration, on the other hand, will not significantly etch titanium-rich silicide. One possible reason for this difference is that an etch chemistry having a high oxygen concentration tends to form titanium oxide which inhibits silicide removal by an etchant.

One etch chemistry to pattern second ($TiSi_x$) conductors or signal lines and second level memory cell material into continuous strips and to define first level memory cell pillars aligned to the edges of the defined second conductors or signal lines 126A and 126B is as follows: $CF_4$ to etch hard mask material 139, and $Cl_2/HBr$ to etch, generally anisotropically, second conductivity material 136, second state change element material 134 and second steering element material 130. To pattern a re-entrant profile in the second level cell material and the first level cell material, the first etch chemistry may be modified at, for example, an experimentally determined point during the etching of the second level memory cell material to a chemistry with a horizontal component, such as $HBr/SF_6$, to form strips of second level cell material having an edge angle ($\alpha_{yz}$) between 85° and 90°. Considerations noted above regarding edge angle of the first level cell material ($\alpha_{xy}$) are applicable here. After patterning the second level cell material into strips having a re-entrant angle, the chemistry may again be modified to an anisotropic chemistry, such as $Cl_2/HBr$ or $HBr/SF_6$.

The described second level etch chemistry carried forward to the first level cell material may be referred to, for purposes of the following discussion, as a "first" etch chemistry (although, as described, more than a single chemistry may have been used). At a point where a consistent profile (e.g., a z-direction profile) including a desired vertical edge angle (e.g., $\alpha_{yz}$ of approximately 90°) of the first level cell pillars may be maintained, and prior to contacting first conductors or signal lines 106A and 106B, the first etch chemistry is modified to a "second" etch chemistry to, in one example, increase the oxygen content of the etch gas. In one example, the $HBr/SF_6$ reactant species is substituted for a species of $HBr/He/O_2$ at a ratio of HBr to $He/O_2$ of one to one or more, with a helium (He) ratio to oxygen ($O_2$) of 80 to 20. For a mixture of $HBr/O_2$, a ratio of one to greater than 0.2 is suitable. This second etch chemistry will pattern the first level cell material into pillars and patterning of first conductors or signal lines 106A and 106B will be inhibited.

The above dual etch chemistry to pattern second level memory strips and first level memory cell pillars is provided as an example of one method of patterning structures of similar components wherein selectivity of one component (e.g., first conductors or signal lines 106A and 106B) over another component of similar material (e.g., second conductors or signal lines 126A and 126B) is desired. It is to be appreciated that for other conductor or signal line materials, including other suicides (e.g., tungsten silicide) or metal materials, different etch chemistries will be suitable but the guidelines set forth will apply with equal moment. The presence or absence of a native oxide may also affect the chosen chemistries.

Referring to the physical process, removal of the first level memory cell material can also be stopped on native oxide 108A and 108B, thus inhibiting the etching of first conductors or signal lines 106A and 106B. Thus, retaining the titanium-rich silicide for first conductors or signal lines 106A and 106B provides the benefit of retaining an oxide layer that can act as an etch stop. As oxygen-rich chemistry such as described above (e.g., HBr/He/O$_2$ or HBr/O$_2$) will stop on native oxide 108A and 108B.

Figure 8:
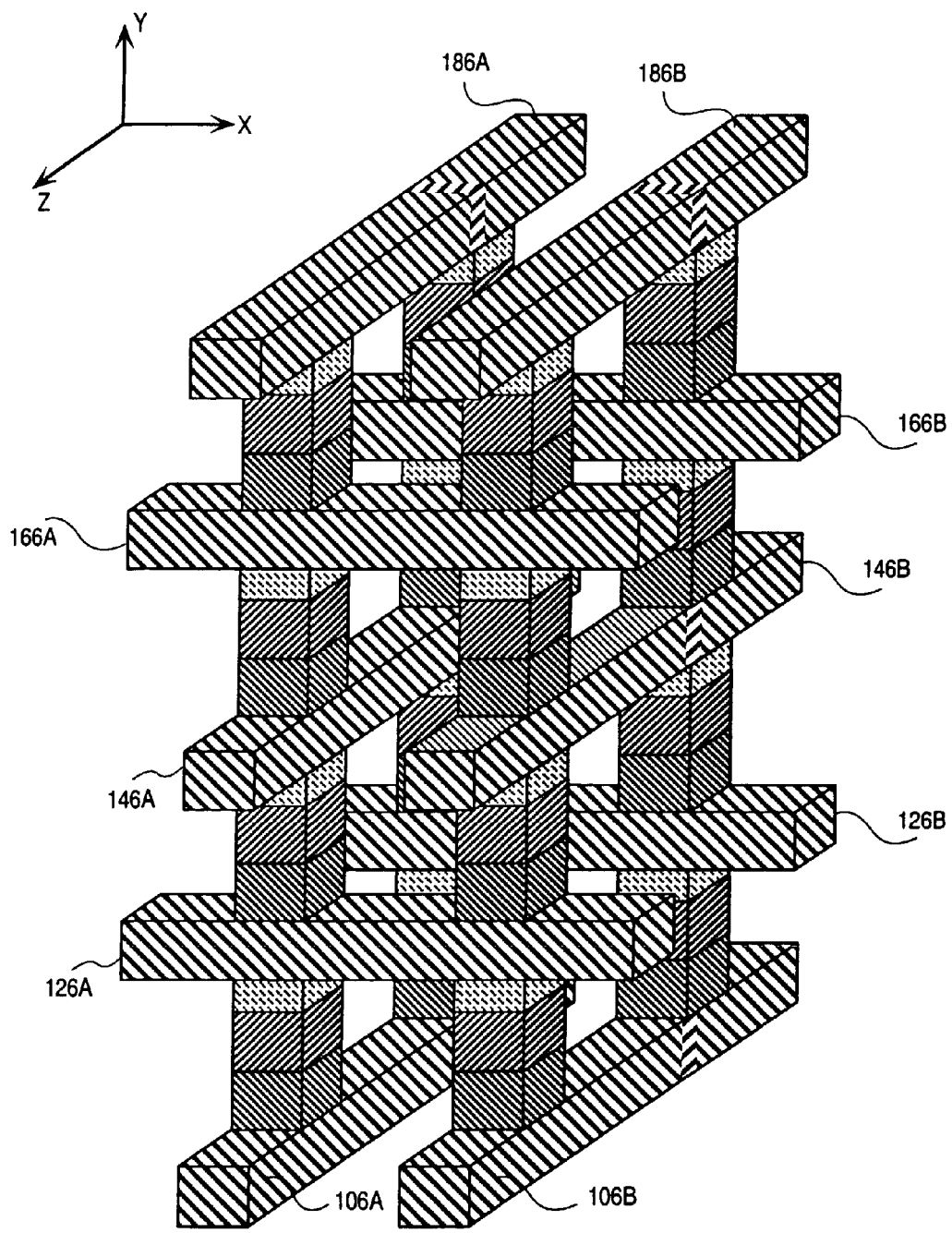
FIG. 8 illustrates a three dimensional memory array formed according to the techniques described in FIGS. 1–7 and having N=4 memory cell levels and N+1=5 conductors or signal lines.

The process steps described above in reference to FIGS. 1–7 may be repeated to form the desired number of memory levels. FIG. 8 shows a three dimensional memory array over substrate 100 that has four memory levels (N=4) between five conductors or signal lines 106A, 106B; 126A, 126B; 146A, 146B; 166A, 166B; and 186A, 186B. It is to be appreciated that after the formation of the final memory cell level, additional conductors or signal lines (N+1) are formed such as described above with respect to conductors or signal lines 106a and 106b. The patterning of the ultimate conductors or signal lines will define the x-direction thickness of the fourth level memory cell pillars aligned to the edge of the fifth conductors or signal lines.

In one embodiment, once the three dimensional memory array is introduced and patterned, the significant thermal processing operations are introduced. For example, the three dimensional memory array is heated to a temperature of approximately 700° C. for approximately 60 minutes to transform the high resistivity titanium silicide to a low resistivity, silicon-rich C54 phase titanium silicide. Any thin oxide material previously formed over the conductors or signal lines (e.g., native oxide 108, native oxide 128) will be consumed during the silicide transformation. FIG. 8 illustrates by hatching patterns, the transformed conductors or signal lines (e.g., transformed to a low resistivity phase). In addition to the transformation of the signal line to a low resistivity phase, any amorphous silicon structures including, for example, the PN diode of each steering element are transformed (e.g., crystallized) by thermal processing after introduction and patterning of the three dimensional memory array.

In the above description of an embodiment of forming a three dimensional memory structure over a substrate, the refractory metal silicide of the conductors or signal lines is retained in a high resistivity phase until after introduction and patterning of the entire memory structure. Alternatively, a second embodiment of a fabrication technique transforms the refractory metal silicide to a low resistivity phase as the structure is introduced and patterned. One reason that it would be desired to change levels of conductor or signal line material to, for example, the low resistivity silicide material during introduction and patterning is that such change may tend to relieve stress in the overall structure that may accumulate while introducing and patterning multiple layers.

In the case of selectively patterning titanium silicides, one way to etch a silicide layer and protect an underlying signal line or conductor is through the introduction of an oxide (e.g., SiO$_2$) over the underlying signal line or conductor and contacting that signal line or conductor with an etch chemistry that disfavors the etching of oxide (e.g., a physical process such as described above). In the case of high resistivity titanium suicides, an oxide over the silicide material is readily formed. Such oxide, as noted above, is usually eliminated during the transformation from the high to the low resistivity material. In instances where the underlying silicide will be transformed and the oxide eliminated, one technique to protect the silicide from a future etch is to incorporate an oxide etch stop into the circuit structure, by, for example, locating a state change element of an SiO$_2$ dielectric antifuse directly over the signal line or conductor.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A structure in a three dimensional circuit wherein the three dimensional circuit comprises a plurality of memory cell levels built over a substrate, the structure comprising tapered pillars between first and second signal lines.

2. The structure of claim 1, wherein each pillar comprises a base having a relatively smaller cross-section towards the substrate and a relatively larger cross-section away from the substrate.

3. The structure of claim 2, wherein each pillar has a sidewall, and the sidewall forms an angle of between about 85 and about 90 degrees relative to a plane parallel in the substrate.

4. The structure of claim 1, further comprising a first plurality of conductive signal lines in a first plane and a second plurality of conductive signal lines in a different second plane, and a portion of the pillars are coupled to and disposed between the first plurality of conductive signal lines and the second plurality of conductive signal lines.

5. The structure of claim 1, wherein more than one of the plurality of memory cell levels comprises an active device.

6. The structure of claim 1, wherein the tapered pillars comprise a memory element.

7. The structure of claim 6, wherein the tapered pillars further comprise at least one steering element.

8. The structure of claim 7, wherein the at least one steering element comprises a diode.

9. An apparatus comprising:
   a first plurality of spaced apart coplanar conductors disposed in a first plane over a substrate;
   a second plurality of spaced apart coplanar conductors disposed in a second plane, the second plane parallel to and different from the first plane and the substrate; and
   a plurality of cells coupled to and disposed between one of the first conductors and one of the second conductors,
   wherein each of the plurality of cells has a re-entrant profile, and
   wherein at least one of the plurality of cells comprises an active device.

10. The apparatus of claim 9, wherein the re-entrant profile is between 85 degrees and 90 degrees relative to the first and second planes.

11. The apparatus of claim 9, wherein a portion of the plurality of cells comprises a memory element.

12. The apparatus of claim 9, wherein a portion of the plurality of cells comprises a steering element.

13. The apparatus of claim 12, wherein the steering element comprises a diode.

14. A three dimensional circuit structure comprising tapered pillars between first and second signal lines disposed in different planes over a substrate, the tapered pillars comprising at least one active device.

15. The structure of claim 14, further comprising a substrate, wherein each pillar comprises a base having a relatively smaller cross-section towards the substrate and a relatively larger cross-section away from the substrate.

16. The structure of claim 14, wherein each pillar has a sidewall, and the sidewall forms an angle of between about 85 and about 90 degrees relative to a plane parallel to the substrate.

* * * * *